US009666694B2

(12) United States Patent
Nishitani et al.

(10) Patent No.: US 9,666,694 B2
(45) Date of Patent: May 30, 2017

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventors: Kazuhito Nishitani, Chigasaki (JP); Katsuhiro Sato, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 125 days.

(21) Appl. No.: 14/477,301

(22) Filed: Sep. 4, 2014

(65) Prior Publication Data

US 2015/0091075 A1    Apr. 2, 2015

(30) Foreign Application Priority Data

Sep. 27, 2013  (JP) ................ 2013-202534
Jul. 25, 2014  (JP) ................ 2014-152435

(51) Int. Cl.
*H01L 29/788* (2006.01)
*H01L 29/66* (2006.01)
(Continued)

(52) U.S. Cl.
CPC .. *H01L 29/66825* (2013.01); *H01L 21/02068* (2013.01); *H01L 21/0337* (2013.01);
(Continued)

(58) Field of Classification Search
CPC ......... H01L 21/28273; H01L 21/02068; H01L 21/0337
See application file for complete search history.

(56) References Cited

U.S. PATENT DOCUMENTS 9,213,242 B2 * 12/2015 Uozumi .................. G03F 7/162
2006/0108647 A1 * 5/2006 Yuan .................. H01L 21/76205
257/396
(Continued)

FOREIGN PATENT DOCUMENTS

JP   2013-42093     *  2/2013  ........... H01L 21/304
TW   200733359 A       9/2007

OTHER PUBLICATIONS

Combined Taiwanese Office Action and Search Report issued Apr. 25, 2016 in Patent Application No. 103129226 (with English language translation).

*Primary Examiner* — Jamie C Niesz
(74) *Attorney, Agent, or Firm* — Oblon, McClelland, Maier & Neustadt, L.L.P.

(57) ABSTRACT

According to one embodiment, a nonvolatile semiconductor memory device is provided. The element isolation insulating bodies form active areas extending in one direction along a surface of a semiconductor substrate in a surface region of the semiconductor substrate, and partition the surface region into the active areas. The tunnel insulating films are formed on the active areas respectively. The floating gate electrodes are formed on the tunnel insulating films respectively. The inter-gate insulating films are formed on the floating gate electrodes. The control gate electrodes are provided on the inter-gate insulating films. The source regions and drain regions are formed in the active areas respectively. Each of the active areas has steps at side surfaces. A width of a portion of each of the active areas deeper than the steps is larger than that of a portion of each of the active areas shallower than the steps.

7 Claims, 3 Drawing Sheets

(51) Int. Cl.
    *H01L 21/02*        (2006.01)
    *H01L 21/033*     (2006.01)
    *H01L 21/28*        (2006.01)
    *H01L 29/423*     (2006.01)

(52) U.S. Cl.
    CPC .. *H01L 21/28273* (2013.01); *H01L 29/42336* (2013.01); *H01L 29/7881* (2013.01)

(56) References Cited

U.S. PATENT DOCUMENTS

| | | | |
|---|---|---|---|
| 2012/0100641 A1* | 4/2012 | Tachibana | H01L 21/28273 438/14 |
| 2012/0329269 A1 | 12/2012 | Arnold et al. | |

* cited by examiner

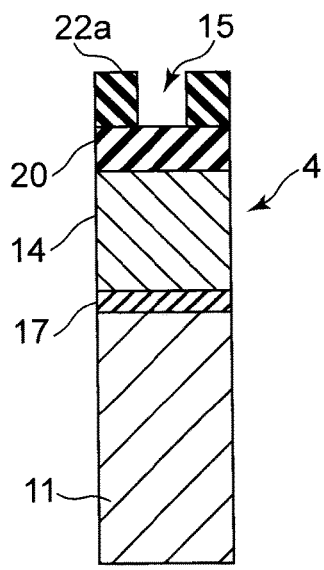
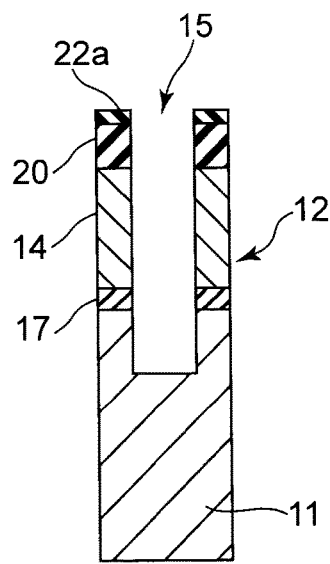
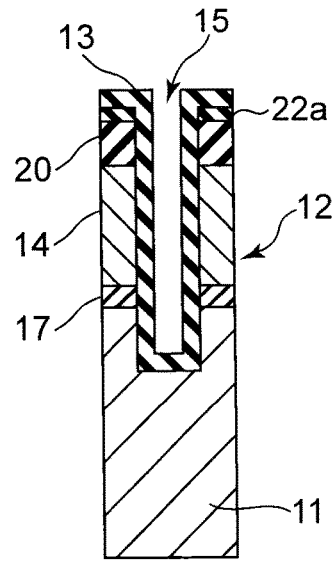
FIG. 2A  FIG. 2B  FIG. 2C
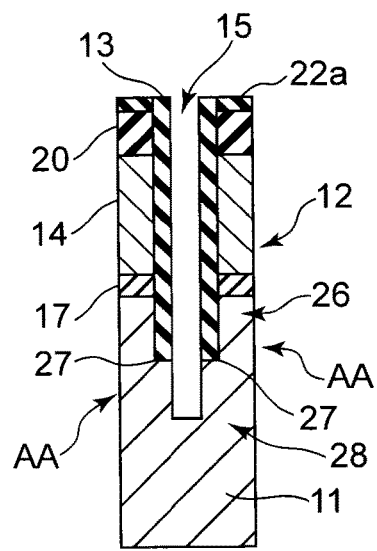
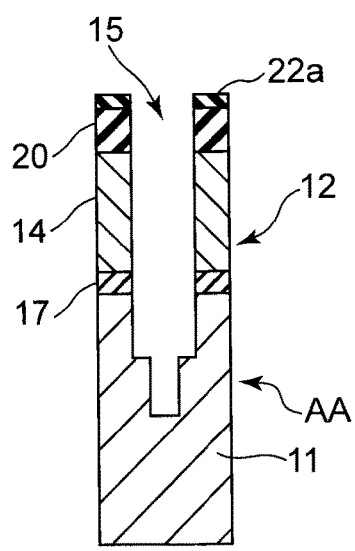
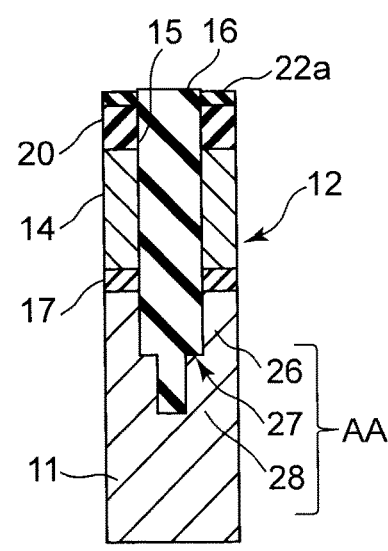
FIG. 2D  FIG. 2E  FIG. 2F

NONVOLATILE SEMICONDUCTOR MEMORY DEVICE AND METHOD OF MANUFACTURING THE SAME

CROSS-REFERENCE TO RELATED APPLICATION

This application is based upon and claims the benefit of priority from the Japanese Patent Application No. 2013-202534 filed on Sep. 27, 2013 and the Japanese Patent Application No. 2014-152435, filed on Jul. 25, 2014, the entire contents of which are incorporated herein by reference.

FIELD

Embodiments described herein relate generally to a nonvolatile semiconductor memory device and a method of manufacturing a nonvolatile semiconductor memory device.

BACKGROUND

In manufacturing a nonvolatile semiconductor memory device such as a NAND flash memory, a tunnel insulating film and a charge storage film for forming floating gate electrodes are formed on a semiconductor substrate. Then, grooves for element isolation are formed on the semiconductor substrate to isolate between adjacent active areas with insulation. By forming the grooves, laminated patterns including portions of the semiconductor substrate, the tunnel insulating film and the charge storage film are formed. Subsequently, a rinsing process is performed. In the rinsing process, the laminated patterns may be collapsed during drying of a rinsing solution.

In recent years, with the miniaturization of patterns, variation easily occurs in the dimension of width of the grooves formed for insulating isolation, i.e., the intervals between adjacent active areas. As a result, variation in the dimension of depth of the grooves also easily occurs, and the above-described laminated patterns are easily collapsed.

As a technique for suppressing collapse of the laminated patterns, a technique of solidification drying is known. In this technique, after the semiconductor substrate is rinsed by a rinsing solution, grooves between adjacent laminated patterns are filled with a solution in which a sublimation substance is dissolved, and the sublimation substance is changed directly from a solid state to a gas state without passing through a liquid state. According to this technique, since surface tension caused by the rinsing solution can be prevented from being exerted on the laminated patterns, it is possible to suppress collapse of the laminated patterns during a drying process.

However, a film-formability of the sublimation substance for the laminated patterns cannot be sufficient depending on the kind of the material constituting the laminated patterns. In such a case, the sublimation substance is not formed well between the adjacent laminated patterns, and the effect of suppressing collapse of the laminated patterns is not obtained sufficiently.

BRIEF DESCRIPTION OF THE DRAWINGS

FIGS. 2A to 2F are cross-sectional views illustrating steps of a method of manufacturing a nonvolatile semiconductor memory device according to an embodiment.

DETAILED DESCRIPTION

Figure 1:
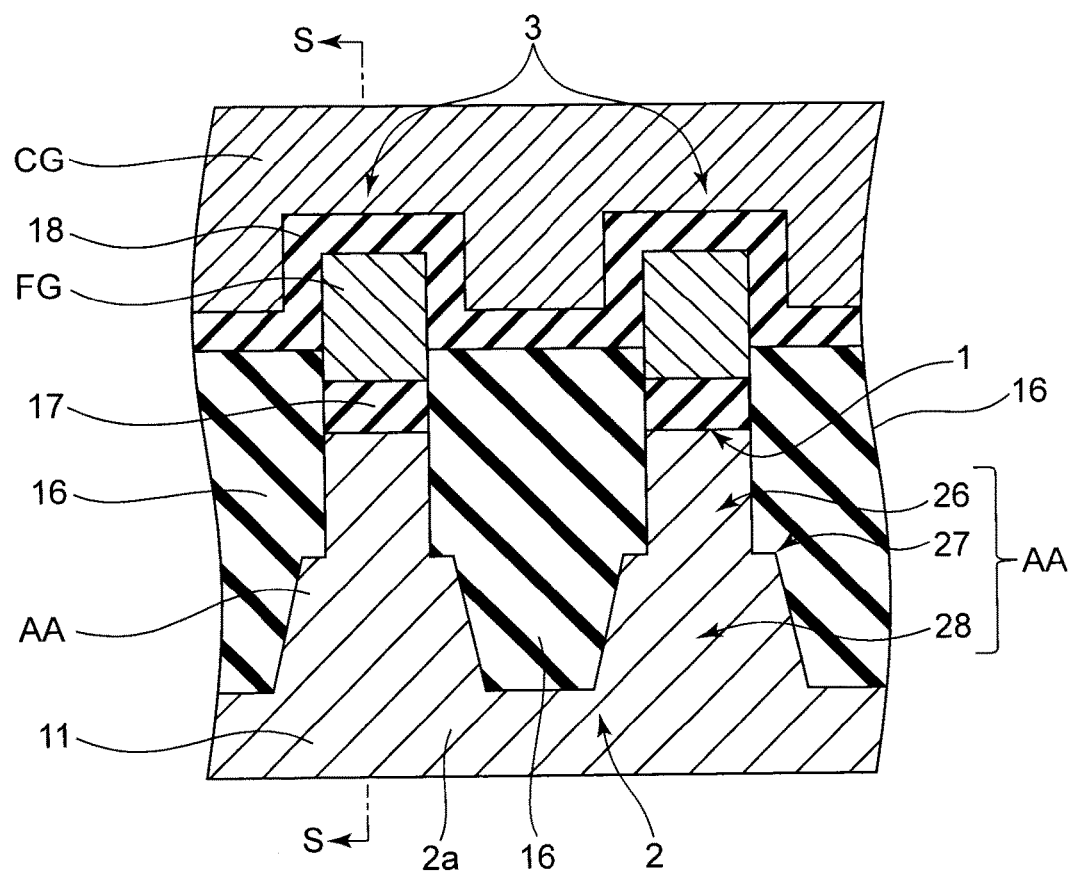
FIG. 1 is a cross-sectional view illustrating a nonvolatile semiconductor memory device according to an embodiment.

According to one embodiment, a nonvolatile semiconductor memory device having a semiconductor substrate, element isolation insulating bodies, tunnel insulating films, floating gate electrodes, inter-gate insulating films, control gate electrodes, source regions and drain regions is provided.

The element isolation insulating bodies are buried in grooves provided in a surface region of the semiconductor substrate to partition the surface region into active areas. The active areas extend in one direction along a surface of the semiconductor substrate and are separated apart from each other. The tunnel insulating films are formed on the active areas respectively. The floating gate electrodes are formed on the tunnel insulating films respectively. The inter-gate insulating films are formed on the floating gate electrodes. The control gate electrodes are provided on the inter-gate insulating films. The source regions and drain regions are formed in the active areas respectively. Each of the active areas has steps at side surfaces. A width of a portion of each of the active areas deeper than the steps is larger than that of a portion of each of the active areas shallower than the steps.

Hereinafter, further embodiments will be described with reference to the drawings. In the drawings, the same reference numerals denote the same or similar portions respectively.

The drawings are illustrated schematically and conceptually, and relations between thicknesses and widths of portions, ratios among the sizes of the portions etc. cannot always be the same as actual ones. In addition, in some cases, although portions are indicated as the same portion in the figures, the dimensions or the ratios of the portions may be different among the figures.

A nonvolatile semiconductor memory device according to an embodiment is, for example, a NAND flash memory. In the nonvolatile semiconductor memory device, a surface region of a silicon substrate which extends in a depth direction from a surface of the substrate is partitioned into active areas in a line shape by element isolation insulating bodies for shallow trench isolation (STI), for example. The surface region of a silicon substrate is an upper layer portion of the substrate. Each of the active areas has steps at side surfaces. The width of a portion lower than the steps is larger than that of a portion higher than the steps. In other words, the width of an upper portion extending from the steps is smaller than that of a lower portion extending from the steps. The "upper portion" denotes a portion which is shallower than the steps in the semiconductor substrate, and the "lower portion" denotes a portion which is deeper than the steps.

Since the width of the upper portion in each active area is small, the interval between the corresponding portions of the adjacent active areas is wide so that electrical influence between the adjacent active areas is difficult to arise. Thus, "erroneous writing", in which erroneous data are written in error in a non-selected memory cell where data is not intended to be stored, can be made difficult to arise.

In addition, since the width of the lower portion is larger than that of the upper portion, a force supporting the upper portion of the active area having a smaller width is large. Thus, it is possible to suppress collapse of the laminated patterns in the active area.

According to a method of manufacturing a nonvolatile semiconductor memory device according to an embodiment, a tunnel insulating film and a charge storage film for forming floating gate electrodes are formed on a semiconductor substrate. Then, grooves are formed in a surface region of the semiconductor substrate by etching. A film on which a solid substance is precipitated easily which is a liner film is formed. Portions of the liner film existing on bottoms of the grooves are removed. The grooves are further etched to a predetermined depth. By the etching, active areas which have steps at side surfaces and where the width of a portion deeper than the steps is larger than that of a portion shallower than the steps are formed. Then, the semiconductor substrate is rinsed by a rinsing solution, and the rinsing solution is dried. The drying may be performed by introducing a solution where a solid substance which is changeable from a solid state to a gas state without passing through a liquid state is dissolved into the grooves of the semiconductor substrate, precipitating at least a solid substance in the grooves, and changing the solid substance from the solid state to the gas state without passing through the liquid state. Subsequently, element isolation insulating bodies are formed in the grooves. In addition, inter-gate insulating films and control gate electrodes are formed above the floating gate electrodes.

According to the above-described method of manufacturing the nonvolatile semiconductor memory device, in the step of forming element isolation, the liner film is introduced into the grooves formed by the laminated patterns including portions of the semiconductor substrate, the tunnel insulating films and the charge storage film. By forming the liner film, it is possible to fill spaces between the adjacent laminated patterns with a solution containing the solid substance securely. In addition, since the solid substance in the solution is changed directly from the solid state to the gas state, it is possible to perform the drying while suppressing exertion of surface tension caused by the rinsing solution on the laminated patterns. Thus, it is possible to obtain the effect of suppressing collapse of the laminated patterns during the drying, more securely.

In addition, after the liner film which is a material having sufficient film-formability of the solid substance is formed on the sidewalls of the laminated patterns, the semiconductor substrate is etched to a predetermined depth so that the steps are formed at the side surfaces of the active areas. Since the width of the lower portion is larger than that of the upper portion, the force supporting the upper portion of the active area having a small width is large so that it is possible to suppress collapse of the laminated patterns of each active area.

Hereinafter, a configuration of a nonvolatile semiconductor memory device according to an embodiment will be described in detail.

Figure 3:
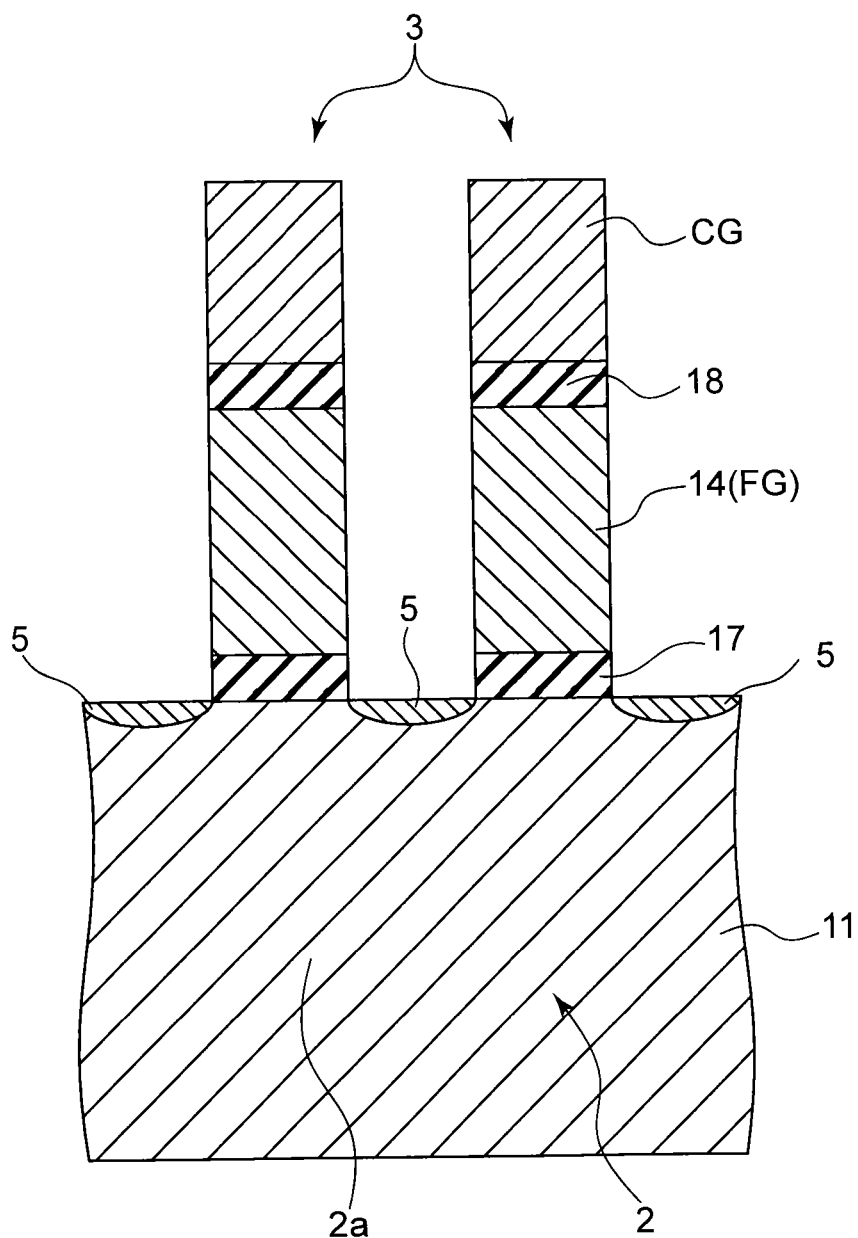
FIG. 3 is a cross-sectional view taken along a surface S-S of FIG. 1.

FIG. 1 is a cross-sectional view illustrating the nonvolatile semiconductor memory device according to the embodiment. FIG. 3 is a cross-sectional view taken along a surface S-S of FIG. 1. In the embodiment, a NAND flash memory is exemplified as the nonvolatile semiconductor memory device.

As illustrated in FIGS. 1 and 3, a silicon substrate 11 as a semiconductor substrate has a surface 1. The silicon substrate 11 has a P-conductivity type surface region 2 in the depth direction from the surface 1. A memory array region 2a and a peripheral circuit region (not illustrated) are defined in the surface region 2. The memory array region 2a is a region which stores data and in which nonvolatile memory transistors 3 as storage elements are formed. The peripheral circuit region is a region which drives the memory array region 2a and in which a peripheral circuit having high voltage resistant transistors, low voltage resistant transistors etc. is provided. The peripheral circuit generates multiple levels of voltages and supplies the generated voltages to the memory array region 2a. In addition, the peripheral circuit includes a circuit for detecting voltages or currents occurring in the memory array region 2a.

Element isolation insulating bodies 16 for shallow trench isolation (STI) which extend in one direction and separated apart from each other are formed in the memory array region 2a of the silicon substrate 11. The element isolation insulating bodies 16 are made of, for example, a silicon oxide. The memory array region 2a of the silicon substrate 11 is partitioned into a plurality of active areas AA (semiconductor regions) by the element isolation insulating bodies 16.

Tunnel insulating films 17 made of a silicon oxide are formed on the active areas AA. Although the tunnel insulating films 17 have an insulating property, when a predetermined voltage within a range of a drive voltage of the nonvolatile memory transistors 3 is applied to the tunnel insulating films 17, a tunnel current flows in the tunnel insulating films 17. Floating gate electrodes FG which are made of a conductive material, for example, polysilicon doped with impurities are formed as charge storage films on the tunnel insulating films 17. The floating gate electrodes FG are provided on the respective active areas AA.

Inter-gate insulating films 18 made of silicon oxide or alumina, for example, are provided on the floating gate electrodes FG. Control gate electrodes CG made of a conductive material, for example, polysilicon doped with impurities are formed on the inter-gate insulating films 18. As illustrated in FIG. 3, N-type semiconductor regions 5 which function as source and drain regions are formed in the memory array region 2a of the surface region 2 of the silicon substrate 11 so as to be separated apart from each other. Channel regions between the semiconductor regions 5 are in contact with the tunnel insulating films 17. Further, insulating layers (not illustrated) and electrodes (not illustrated) which are formed so as to be buried in contact holes provided in the insulating layers are provided on the semiconductor regions 5.

The cross sections of the active areas AA have a shape of step. More specifically, each of the active area AA has a step portion 27, and has an upper portion 26 and a lower portion 28 in the order from an upper side (a side of the surface 1) in an up-down direction (in a depth direction) with the step portion 27 defined as a boundary. The width of the upper portion 26 is smaller than that of the lower portion 28. In other words, the width of the lower portion 28 is larger than that of the upper portion 26. The width of the lower portion 28 is larger by 2% or more than that of the upper portion 26. For example, the width of the step portion 27 is 0.3 nm or more. The "width" of each active area denotes a length of each active area AA in a direction perpendicular to a direction where each active area AA extends.

In the active areas AA, the step portions 27 exist at positions which are apart downward from boundary surfaces between the tunnel insulating films 17 and the silicon substrate 11 i.e. from the surface 1 by 25 nm or more. Particularly, it is desirable that the step portions 27 are located 50 nm or more to 100 nm or less downward from the boundary surfaces. As to intervals between the adjacent active areas AA, the intervals of the portions above the step portions 27 are wide, and those of the portions below the step portions 27 are narrow. At least to the depth of 25 nm downward from the boundary surfaces between the tunnel insulating films 17 and the silicon substrate 11, the intervals between the adjacent active areas AA are maintained to be wide and almost uniform as shown in FIG. 1. The lower portions 28 may have a tapered shape as illustrated in FIG. 1. Otherwise, as a portion of the active area AA is deep, the width of the portion may be large.

According to the nonvolatile semiconductor memory device of the embodiment, since the width of the lower portion of each active area is larger than that of the upper portion of the active area, a force supporting the upper portion of the active area having a small width becomes large. Thus, as described below, in manufacturing the nonvolatile semiconductor memory device, it is possible to suppress collapse of the laminated patterns including the charge storage films, tunnel insulating films and the portions of the silicon substrate which are interposed between the grooves formed to bury the element isolation insulating bodies. Particularly, in a case where the lower portion of each active area has a tapered shape, the width of a portion of the active area is increased as the portion of the active area is lower so that collapse of the laminated patterns is difficult to occur. In addition, since the width of the upper portion of the active area is small, the interval with respect to an adjacent active area is wide so that electrical influence from the adjacent active area is difficult to arise. Thus, "erroneous writing", in which erroneous data are written in error in a non-selected memory cell where data is not intended to be stored, can be made difficult to arise. Particularly, in the nonvolatile semiconductor memory device according to the embodiment, the interval between the adjacent active areas is maintained to be wide from the boundary surface on the tunnel insulating film down to 25 nm in the depth direction. Thus, a space which can prevent causing interference between the adjacent active areas is secured so that "erroneous writing" is difficult to occur.

A method of manufacturing a nonvolatile semiconductor memory device according to an embodiment will be described.

FIGS. 2A to 2F are cross-sectional views illustrating steps of the method of manufacturing the nonvolatile semiconductor memory device according to the embodiment. Particularly, FIGS. 2A to 2F illustrate steps of forming element isolation insulating bodies 16 of a NAND flash memory.

In FIG. 2A, a silicon substrate 11 is prepared as a semiconductor substrate. Ions are injected into the silicon substrate 11 to form necessary impurity profile in a surface region of the silicon substrate 11. Then, a tunnel insulating film 17, a polysilicon film 14, a silicon nitride film 20, a silicon oxide film for forming a hard mask for selective etching, and a resist layer (not illustrated) are sequentially formed and laminated on the silicon substrate 11. The tunnel insulating film 17 is formed of a silicon oxide film. The polysilicon film 14 is formed to be used as floating gate electrodes. The silicon nitride film 20 is formed to be used as a stopper film in a subsequent chemical mechanical planarization (CMP) process which is applied to element isolation insulating bodies described below. By using a multi-patterning technique, the resist layer is patterned and a step of patterning the silicon oxide film for forming the hard mask is performed using the patterned resist layer as a mask so as to form a hard mask 22a. As a result, a laminated structure body 4 having the tunnel insulating film 17, the polysilicon film 14, the silicon nitride film 20, and the hard mask 22a are formed on the silicon substrate.

Then, as illustrated in FIG. 2B, the silicon nitride film 20 and the polysilicon film 14 constituting the laminated structure body 4 are selectively etched by using the hard mask 22a as a mask, and the tunnel insulating films 17 is further selectively removed. At this time, the hard mask 22 is also etched to some extent so that the hard mask 22a becomes thin. Then, laminated patterns 12 and grooves 15 for element isolation are formed by etching the silicon substrate 11 by a depth of 25 nm or more from the surface of the silicon substrate 11. The etching depth is 50 nm to 100 nm desirably. The grooves 15 are formed between the laminated patterns 12.

Then, process residues due to the etching are removed by rinsing the grooves 15 by a rinsing solution. In the rinsing process, since the aspect ratio of the laminated pattern 12 is not so large, even if the rinsing solution is dried in a liquid state, the possibility of collapsing the laminated patterns 12 is small.

Subsequently, as illustrated in FIG. 2C, a liner film 13 is formed as an insulating film on bottoms of the grooves 15, the sidewalls of the laminated patterns 12, and the hard mask 22a. The liner film 13 is a silicon oxide film or a silicon nitride film, for example. The liner film 13 is formed in order to provide a film which is made of a material having a sufficient film-formability of a sublimation substance described below on the sidewalls of the laminated patterns 12. It is desirable that the liner film 13 is formed to have a thickness of 0.3 nm or more. The liner film 13 may be formed by an Atomic Layer Deposition (ALD) or a Low Pressure Chemical Vapor Deposition (LP-CVD).

Then, a surface of the liner film 13 is oxidized or nitrided, or a processing using a solvent such as a silane coupling agent is applied to the surface of the liner film 13. According to these treatments, at least one of functional groups including an alkyl group, a vinyl group, an allyl group, a hydroxy group, an aldehyde group, a carbonyl group, a carboxy group, a nitro group, a sulfo group, a sulfonyl group, an aryl group, a trialkylsilyl group, a tris-(fluoroalkyl) silyl group, a trialkylsiloxy group, and a tris-(fluoroalkyl) siloxy group is formed on the surface of the liner film 13 to enhance the film-formability of a sublimation substance for the laminated patterns 12. The chemical structures of the functional groups may include any one of a —$C_xH_{2x+2}$ group (X is an arbitrary positive integer), a —$C_2H_3$ group, a $C_3H_5$ group, a —OH group, a —COR group (R is H, OH, or $C_xH_{2x+2}$), a —$NO_2$ group, —$SO_2R^2$ ($R^2$ is OH or $C_xH_{2x+2}$), a —$C_6H_5$ group, a —$SiR^3_3$ group ($R^3$ is $C_xH_{2x+2}$), a —$SiR^4_3$ group ($R^4$ is $C_xH_yF_z$), a —$OSiR^5_3$ group ($R^5$ is $C_xH_{2x+2}$), or a —$OSiR^6_3$ group ($R^6$ is $C_xH_yF_z$).

Then, as illustrated in FIG. 2D, the grooves 15 are further removed by etching to a desired depth by reactive ion etching (RIE). Before the further etching of the grooves 15, portions of the liner film 13 located on the bottom of the grooves 15 and the hard masks 22a are removed in advance by the RIE. By the additional etching of the grooves 15, the aspect ratio of each of the laminated patterns 12 becomes large. In this step, since the portions of the silicon substrate 11 covered with the remaining liner film 13 are not etched, step portions 27 are formed on the side surfaces of the active areas AA as illustrated in FIG. 2D.

As a result of this step, the active areas AA are formed so that the width of the lower portions 28 becomes larger than that of the upper portions 26. Particularly, the lower portions 28 can be formed to have a tapered shape by using RIE.

Subsequently, in order to remove etching products, the grooves 15 are rinsed. Since the rinsing process is performed in a state where the aspect ratios of the laminated patterns 12 are large, the laminated patterns 12 can be collapsed during drying of a rinsing solution. Thus, in the embodiment, as a method of drying the rinsing solution after rinsing, drying for removing the rinsing solution while sublimating a sublimation substance is performed by using a solution in which the sublimation substance is dissolved. As the sublimation substance, for example, iodine, naphthalene, benzotriazole (BTA) etc. may be used. The sublimation substance is not limited to these materials, but other substances which are sublimated at a high temperature and are in a solid state at the room temperature may be used. As the solution for dissolving such a solid sublimation substance, toluene, benzene, xylene, hexane, heptane, ethyl acetate, propyl acetate, butyl acetate, acetone, perfluorooctane, perfluorononanoic, perfluoro cyclopentane, perfluorocyclohexane, pentafluoropropane, methanol, ethanol, propanol, butanol, propylene glycol monomethyl ether acetate (PGMEA), diethylene glycol, dimethyl ether, formamide, N,N-dimethyl formamide, N,N-dimethylacetamide, N-methyl-2-pyrrolidone etc. may be used.

More specifically, the case of using benzotriazole as the sublimation substance will be described. An isopropanol solution including benzotriazole in a concentration range of 0.01 g/ml to 0.1 g/ml which makes the film thickness easy to control is made to contact with the laminated patterns 12 in a state where the laminated patterns are wetted by the rinsing solution. Then, by performing a heat treatment at a temperature of 50° C. to 100° C., at least a portion of the solution where the sublimation substance is dissolved is changed into a solid. More specifically, the solid sublimation substance is precipitated on the surface of the liner film 13. Subsequently, by heating the laminated patterns 12 in the conditions of a pressure of 0.1 Pa to 20 Pa and a temperature of 50° C. to 150° C., the precipitated solid-state sublimation substance is removed by sublimation. Since the sublimation substance is changed from a solid state to a gas state without passing through a liquid state, surface tension which is caused by the rinsing solution or a liquid such as the above-described solution is not exerted on the laminated patterns 12, and it is possible to suppress collapse of the laminated patterns 12 during drying.

Then, as illustrated in FIG. 2E, the liner film 13 is removed by etching. The etching may be performed by using, for example, fluorine radical species. As described above, the liner film 13 is a silicon oxide film or a silicon nitride film which holds any one of the functional groups including an alkyl group, a vinyl group, an allyl group, a hydroxy group, an aldehyde group, a carbonyl group, a carboxy group, a nitro group, a sulfo group, a sulfonyl group, an aryl group, a trialkylsilyl group, a tris-(fluoroalkyl) silyl group, a trialkylsiloxy group, and a tris-(fluoroalkyl) siloxy group, on the surface of the liner film 13. In a case where the liner film 13 is a silicon oxide film, instead of removing the entire liner film 13, any one of the functional groups held on the surface of the liner film 13 may be removed and the liner film 13 may remain.

Then, as illustrated in FIG. 2F, element isolation insulating bodies 16 are formed by burying an insulating material such as a silicon oxide in the grooves 15. Subsequently, the hard masks 22 and the silicon nitride films 20 are removed. Further, the element isolation insulating bodies 16 are etched to some extent in a depth direction so that an upper portions of the insulating bodies 16 are removed.

Then, as illustrated in FIGS. 1 and 3, an inter-gate insulating film 18 made of silicon dioxide and a polysilicon film for forming control gate CG electrodes are formed and laminated on the polysilicon film 14 for forming floating gate electrodes FG. The control gate electrodes CG and the floating gate electrodes FG are formed by selectively removing the former polysilicon film, the inter-gate insulating film 18, the polysilicon film 14 and the tunnel insulating film 17. By performing ion injection onto the entire surface, N-type semiconductor regions 5 which are used as source regions and drain regions are formed on the active areas AA of the silicon substrate 11. The semiconductor regions 5 are formed to be separated apart from each other in a direction of the surface 16 of the silicon substrate 11. The tunnel insulating film 17 exists on channel regions between the semiconductor regions 5. Then, an insulating layer (not illustrated) is formed on the semiconductor regions 5, and contact holes are further formed in the insulating layers. Source electrodes and drain electrodes are formed in the contact holes respectively.

In the above-described manufacturing method, at least a portion of the solution including the sublimation substance is changed into a solid. In addition, the sublimation substance is removed by changing the sublimation substance from a solid state to a gas state by sublimation. Instead of the sublimation substance and the method of removing the sublimation substance, other solid substances or other methods may be used. For example, instead of the sublimation substance or together with the sublimation substance, a polymer material may be used. In order to make the solution containing the solid substance to contact with the laminated patterns 12 and to change at least a portion of the solution into a solid, any one of the processes of reacting with the solution, decreasing an amount of a solvent contained in the solution, or precipitating at least a portion of the substance dissolved in a solvent may be used.

In order to change the solid precipitated from the solution from a solid state to a gas state, any one of sublimation, decomposition, or reaction of the solid may be performed. In addition, the change from the solid state to the gas state may be performed by any one of a heating process, a light illumination process, an electron beam irradiation process, a decompression process, or a process using a gas reacting with the solid substance. According to the manufacturing method of the embodiment, since the width of the lower portions 28 of the active areas AA is larger than that of the upper portions 26, it is possible to suppress occurrence of collapse of the laminated patterns 12. Further, in the manufacturing method, the solution including the solid substance is made to contact with the laminated patterns 12 in a state where the laminated patterns 12 are wetted by a rinsing solution. Then, at least a portion of the solution is changed into a solid, and the solid substance is removed by changing the solid substance from a solid state to a gas state. Thus, exertion of the surface tension caused by the rinsing solution on the laminated patterns 12 is suppressed so that it is possible to further suppress occurrence of collapse of the laminated patterns 12 during drying.

In addition, before drying using the solution including the solid substance, a liner film 13 which is made of a material having a film-formability of the solid substance is formed on the sidewalls of the laminated patterns 12 so that the solid substance may be sufficiently formed on the liner film 13.

According to the manufacturing method, during drying of the rinsing solution, it is possible to remove a solid precipitated from the solution including the solid substance by directly changing the solid from a solid state into a gas state. As a result, the surface tension caused by the rinsing solution or a liquid such as the above-described solution is not exerted on the laminated patterns 12 so that it is possible to suppress collapse of the laminated patterns 12 during drying.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile semiconductor memory device comprising:

forming a tunnel insulating film and a charge storage film for forming floating gate electrodes on a surface region of a semiconductor substrate;

forming grooves by etching the charge storage film, the tunnel insulating film and portions of the surface region selectively;

etching the portions of the surface region forming the grooves to a predetermined depth so that active areas having steps are formed, a width of a portion of each of the active areas deeper than the steps being larger than that of a portion of each of the active areas shallower than the steps;

rinsing the semiconductor substrate by a rinsing solution;

burying element isolation insulating bodies in the grooves;

forming inter-gate insulating films and control gate electrodes on the charge storage films;

forming a source region and a drain region in each of the active areas so as to be separated apart from each other;

forming a liner film on sidewalls forming the grooves after forming the grooves and before etching the surface region forming the grooves to the predetermined depth;

introducing a solution in which a solid substance changeable from a solid state to a gas state without passing through a liquid state is dissolved into the grooves, precipitating the solid substance at least in the interiors of the grooves, changing the solid substance from the solid state to the gas state without passing through the liquid state, and removing the liner film, after rinsing the semiconductor substrate and before forming the element isolation insulating bodies; and wherein the liner film is formed of an insulating film having at least one of functional groups including an alkyl group, a vinyl group, an allyl group, a hydroxy group, an aldehyde group, a carbonyl group, a carboxy group, a nitro group, a sulfo group, a sulfonyl group, an aryl group, a trialkylsilyl group, a tris-(fluoroalkyl) silyl group, a trialkylsiloxy group, and a tris-(fluoroalkyl) siloxy group on the surface.

2. The method according to claim 1, wherein the liner film is a material capable of presenting film-formability of the solid substance.

3. The method according to claim 1, further comprising performing a surface processing to the liner film in order to enhance film-formability of the solid substance.

4. The method according to claim 1, wherein the liner film is formed of a silicon oxide film or a silicon nitride film.

5. The method according to claim 3, wherein the liner film is formed of a silicon oxide film or a silicon nitride film.

6. The method according to claim 1, wherein the precipitation of the solid substance is performed by changing at least a portion of the solution into a solid, by making the solution contact with the grooves to perform any one of the processes of making the solution react, decreasing an amount of a solvent contained in the solution, or precipitating at least a portion of the solid substance dissolved in the solution.

7. The method according to claim 1, wherein changing the solid substance from the solid state to the gas state is performed by any one of sublimation, decomposition or reaction of the solid substance.

* * * * *